United States Patent [19]

Brannon

[11] Patent Number: 5,087,884
[45] Date of Patent: Feb. 11, 1992

[54] OPEN HEAD DETECTION CIRCUIT AND METHOD

[75] Inventor: Craig M. Brannon, Golden Valley, Minn.

[73] Assignee: VTC Bipolar Corporation, Bloomington, Minn.

[21] Appl. No.: 546,009

[22] Filed: Jun. 28, 1990

[51] Int. Cl.⁵ ............ G01R 31/08; G01R 33/12
[52] U.S. Cl. ............ 324/523; 324/527; 324/537; 324/546; 324/656; 324/212
[58] Field of Search ............ 324/537, 538, 522, 523, 324/527, 546, 71.1, 656, 654, 210, 211, 212

[56] References Cited

U.S. PATENT DOCUMENTS

| | | |
|---|---|---|
| 3,681,682 | 8/1972 | Cox et al. ............ 324/546 X |
| 4,203,137 | 5/1980 | Beck et al. ............ 360/31 |
| 4,323,844 | 4/1982 | Mikame ............ 324/212 |
| 4,656,420 | 4/1987 | Felleisen et al. ............ 324/212 |
| 4,746,869 | 5/1988 | Schrag et al. ............ 324/546 |
| 4,754,222 | 6/1988 | Felleisen et al. ............ 324/212 |
| 4,764,729 | 8/1988 | Yakuwa et al. ............ 324/546 |
| 4,862,078 | 8/1989 | Kawabata ............ 324/212 |
| 4,866,376 | 9/1989 | Fujiki et al. ............ 324/538 X |

Primary Examiner—Kenneth A. Wieder
Attorney, Agent, or Firm—Kinney & Lange

[57] ABSTRACT

An open head detection circuit for detecting an open-circuit condition in a magnetic head connected to head contacts. The detector circuit includes a threshold source which generates a threshold voltage that is between a head contact voltage representative of a connected head and a head contact voltage representative of an open head. A comparator, coupled to receive head voltage signals from the head contacts and coupled to the threshold source, compares the head voltage signals to the threshold voltage and generates comparator signals representative of the comparison. Sampling circuitry, coupled to the comparator and coupled to receive write data signals, samples the comparator signals after detection of the write data signals and before the write data signals affect the comparator signals.

21 Claims, 3 Drawing Sheets

OPEN HEAD DETECTION CIRCUIT AND METHOD

BACKGROUND OF THE INVENTION

The present invention relates to an open head detector circuit for detecting an open-circuit condition in a magnetic head of a magnetic storage system.

In a magnetic storage system, such as a computer disk drive, digital information is magnetically stored upon the surface of a magnetic disk. The digital information is represented by selectively polarizing the magnetic field of consecutive areas across the surface of a rotating magnetic disk. When the information is read back from the storage disk, changes in the magnetic polarization of the medium are sensed and converted into data peaks in an electrical output signal. The reading and writing operations are performed through a magnetic read/write head which is suspended over the surface of the rotating disk.

The magnetic read/write head includes an inductive coil. Information is written on the disk surface by applying a strong current to the inductive coil. This current creates a magnetic field in either a first direction or in a second direction, depending upon the direction of current flow through the inductive coil. The magnetic field polarizes the magnetic field of the disk surface area directly adjacent the magnetic head. As the disk rotates, adjacent bit positions on the disk surface pass beneath the magnetic head and are polarized by the magnetic field induced by the magnetic head.

Digital information is recorded on the disk surface by reversing the polarization of selected bit positions on the disk surface. In one typical magnetic storage system, the digital information is encoded such that no more than 7 ZERO's are consecutively written to the disk surface. A digital ZERO in the encoded information is written by polarizing a particular bit position in the same direction as the previous, adjacent bit position. In contrast, a digital ONE is written by reversing the polarization the particular bit position so it is opposite to the polarization of the previous, adjacent bit position. A second digital ONE is written by again, reversing the polarization of the next adjacent bit position. The magnetic polarization is reversed by reversing the direction of current flow through the inductive coil in the magnetic head.

The digital information is read back from the disk surface by sensing changes, or reversals, in magnetic polarization from one bit position to the next. For example, no change in magnetic polarization represents a digital ZERO, while a reversal represents a digital ONE. As the magnetic disk rotates beneath the inductive coil, oppositely polarized bit positions passing beneath the magnetic head create a changing magnetic field across the inductive coil. This changing magnetic field induces current in the coil to create a data peak or pulse in an electrical output signal at the head contacts. The magnetic storage system monitors the electrical output signal and converts the signal to a digital representation, based upon the presence or absence of the data peaks.

Performance of the magnetic storage system depends greatly upon its ability to accurately and reliably read and write information onto the disk surface. When the magnetic head is not functioning properly, false data may be read from the disk or the information may not be written as intended.

One form of magnetic head malfunction is an open head condition. An open head condition occurs when the inductive coil breaks or does not make electrical contact with the head contacts. In other words, the inductive coil creates an open-circuit between the head contacts.

Magnetic storage systems typically include open head detection circuitry that can perform fault detection on the magnetic head. During operation, if the magnetic head malfunctions, the open head detection circuitry notifies the storage system of the malfunction by means of an open head fault signal to prevent the storage system from attempting to write data through the defective head. During operation, the storage system may use the open head fault signal to shut down the system and signal its operator to replace the defective head so that no data is lost. During manufacture, the detection circuitry may be used to test for faulty manufacturing connections and for head integrity before the storage system is shipped to the customer.

One method of detecting an open head condition includes threshold detection. Differential head voltages across the head contacts are measured and compared to a threshold voltage representative of a functioning head. During a write operation, a large current is forced through the inductive coil. In a functioning head, after write data circuitry reverses current direction, the differential head voltage initially becomes large. After a period of time, the differential head voltage drops until it stabilizes to a write current, head resistance product ($I_{write} * R_{head}$) before the next reversal in write current occurs. In a defective head, the differential head voltages never stabilize near the $I_{write} * R_{head}$ product, but remain large.

The differential head voltage characteristics may be used to identify an open-circuit condition in the magnetic head by comparing the differential head voltage signals to the threshold voltage. If the differential signals are mostly higher than the threshold voltage, this indicates that the differential signals have not stabilized to the $I_{write} * R_{head}$ product and that a fault condition exists.

Beck et al, U.S. Pat. No. 4,203,137, disclose an example of a threshold detector used in a magnetic read/write circuit. Beck et al disclose a magnetic head preamplifier with an electrical short detector for detecting electrical shorts in magnetic heads and head wiring. During write mode, the threshold detector monitors differential voltages across the magnetic head contacts. If the differential voltages are greater than a threshold voltage most of the time, the system is writing into a normal, operative head (not shorted). If the differential voltages are less than the threshold voltage for most of the time, this is an indication of a shorted head. The threshold detector disclosed in Beck et al may be adapted to detect open head conditions rather that head shorts.

Felleisen et al, in U.S. Pat. Nos. 4,754,222 and 4,656,420, disclose another example of the use of a threshold detector in magnetic read/write circuitry. Felleisen et al disclose a circuit arrangement for detecting faults on magnetic recording media. Recorded digital signals are sensed by a magnetic head and measured by threshold detectors to detect drop-ins (extra pulses) or drop-outs (missing pulses). The threshold detector determines whether data stored on the recording media has been lost or whether extraneous information has been stored on the media.

In another method of detecting an open head condition, a threshold detection circuit is used in combination with a timing circuit. In this method, the detector circuit determines whether the differential voltages exceed the threshold voltage for a fixed amount of time. Typically, the threshold voltage is selected to be slightly larger than the $I_{write} * R_{head}$ product. The timing circuit is triggered by a write data signal that initiates a reversal in current flow through the head. The timing circuitry compares the differential head voltage to the threshold voltage at a given time after the initiation of the reversal in head current. If the differential head voltage has not yet stabilized to the $I_{write} * R_{head}$ product, the open head detection circuitry flags a fault signal which halts disk drive operation. The disk drive notifies its host computer that the information was not stored as desired and maintenance is required.

Several problems arise with the open head detection circuits of the prior art. In practical applications, disk drives operate with wide ranges of head loads (head inductance), write currents and data rates. For example, the head inductance may vary from about 0.2 to about 3.0 micro-henries, depending upon the manufacturer. Physical parameters of the electronic components which form the write data circuitry may vary from one drive to the next, resulting in a variance in write current through the magnetic head. This causes a fluctuation between drives in the expected differential voltage ranges and the length of time the voltages take to stabilize. These fluctuations may be as great as an order of magnitude. Therefore, the threshold voltages and timing circuitry may not be accurate with respect to a particular drive.

As a result, open head detector circuits of the prior art are not fully reliable. These circuits may report false errors or fail to report valid errors. Further, these circuits are not easily adaptable to disk drives made by other manufacturers or in different product families. Each detector circuit must be specifically designed for the particular drive in which it is to be used.

There is a continuing need for improved open head detection schemes. It is desirable to have an open head detector circuit which is substantially insensitive to variations in physical parameters and to variations in data rates between the write data circuitry of different disk drives.

SUMMARY OF THE INVENTION

The present invention is an open head detector circuit for detecting an open-circuit condition in a magnetic head. The detector circuit is insensitive to variations in head load (i.e. head inductance) and the rate at which data is written through the magnetic head. The detector circuit is configured for use with write data circuitry electrically coupled to first and second head contacts of the magnetic head. The write data circuitry controls current flow through the magnetic head in response to write data signals.

The detector circuit comprises a threshold source which generates a threshold voltage that is between a head contact voltage representative of a connected head and a head contact voltage representative of an open head. A comparator, coupled to receive head voltage signals from the first and second head contacts and coupled to the threshold source, compares the head voltage signals to the threshold voltage and generates comparator signals representative of the comparison. Sampling circuitry, coupled to the comparator and coupled to receive the write data signals, sample the comparator signals after detection of the write data signals and before the write data signals affect the comparator signals through changes to the differential head voltage signals.

In a preferred embodiment, the detector circuit further includes a differential amplifier having a first input terminal electrically connected to the first head contact, a second input terminal electrically connected to the second head contact and an output terminal which produces amplified differential head voltage signals. The comparator includes a first input terminal electrically connected to receive the amplified differential head voltage signals, a second input terminal electrically connected to the threshold source and an output terminal providing the comparator signals.

Preferably, the comparator signals are digital comparator signals indicative of whether the differential voltages are greater than or less than the threshold voltage. The sampling circuitry comprises a D-type flip-flop having a data input terminal electrically connected to receive the digital comparator signals from the comparator output terminal, a clock input terminal electrically connected to receive the write data signals, and an output terminal providing open head fault signals based upon the sampled digital comparator signals.

Because the sampling circuitry is triggered directly by the write data signals, rather than by a given time period after receipt of a write data signal, the open head detector circuit of the present invention is insensitive to variations in timing between read/write circuitry of different disk drives. The open head detector circuit of the present invention is also relatively insensitive to variations in differential voltages from one disk drive to the next because the stabilized differential voltages of an open head are relatively large (by an order of magnitude) compared to the differential voltages of a connected head. This provides a wide voltage range from which to select a threshold voltage enabling the invention to function with a high degree of accuracy.

DETAILED DESCRIPTION OF THE PREFERRED EMBODIMENTS

Figure 1:
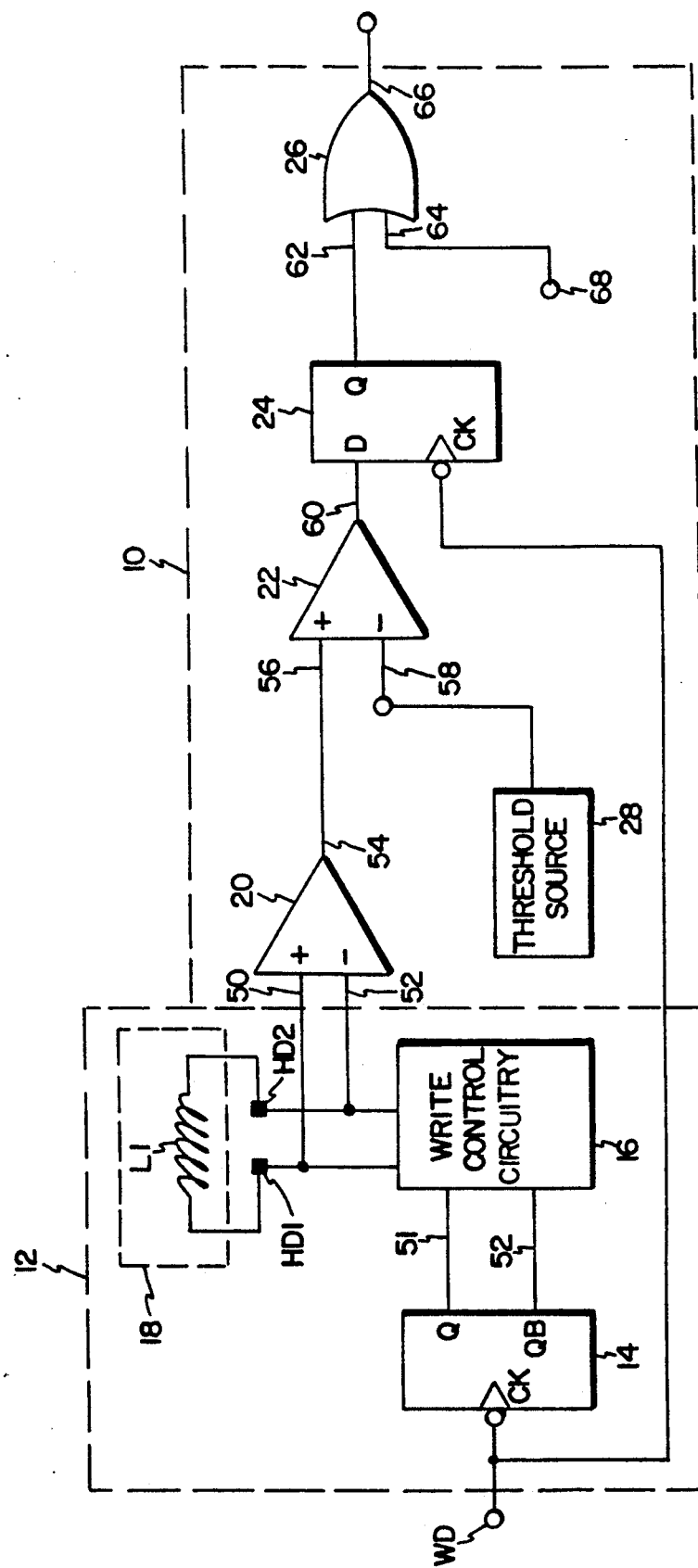
FIG. 1 is a schematic representation of an open head detector circuit in accordance with the present invention.

FIG. 1 is a schematic representation of an open head detector circuit in accordance with the present invention. Open head detector circuit 10 is electrically coupled to write data circuitry 12 of a magnetic storage system. Write data circuitry 12 includes toggle-type flip-flop 14, write control circuitry 16 and magnetic head 18. Write data circuitry such as that shown at 12 is known and commonly used to drive magnetic heads such as head 18. Open head detector circuit 10 includes differential amplifier 20, comparator 22, D-type flip-flop 24, OR-gate 26 and threshold source 28. Open head detector circuit 10 monitors differential voltage signals at head contacts HD1 and HD2 to determine whether magnetic head 18 is defective.

Write Data Circuitry

During operation, write data circuitry 12 receives write data signals at a write data terminal WD. Preferably, the write data signals are formed by digital data pulses. Each pulse triggers a reversal in current direction through magnetic head 18. The data pulses represent encoded data transitions in the information being stored through magnetic head 18.

Terminal WD connects the write data signals to clock input terminal CK of toggle-type flip-flop 14. Toggle-type flip-flop 14 includes complementary output terminals Q and QB that toggle between logic HIGH and logic LOW states in response to the digital data pulses received at terminal CK. In a preferred embodiment, toggle-type flip-flop 14 is an edge-triggered flip-flop that toggles the logic states at output terminals Q and QB at the falling edge of each data pulse.

The output terminals Q and QB provide complementary write data control signals that are electrically connected to select terminals S1 and S2 of write control circuitry 16. Write control circuitry 16 is electrically connected to magnetic head 18 at head contacts HD1 and HD2. Write control circuitry 16 controls current direction through magnetic head 18 in response to the complementary write data control signals received at select terminals S1 and S2. When the logic states at terminals S1 and S2 reverse, write control circuitry 16 reverses the direction of current flow through magnetic head 18.

Magnetic head 18 includes inductive coil L1 that creates a magnetic field having a direction dependant upon the direction of current flow through coil L1. In the magnetic storage system, magnetic head 18 is positioned directly adjacent a magnetic storage media (not shown), such as a rotating magnetic disk or a magnetic tape. During a write operation, the magnetic field created by inductive coil L1 polarizes bit positions on the storage media in either a first direction or in a second direction, based upon the direction of current flow through coil L1. By controlling current flow through coil L1, write control circuitry 16 can write digital information on the magnetic storage media at adjacent bit positions as the bit positions pass inductive coil L1.

Figure 2:
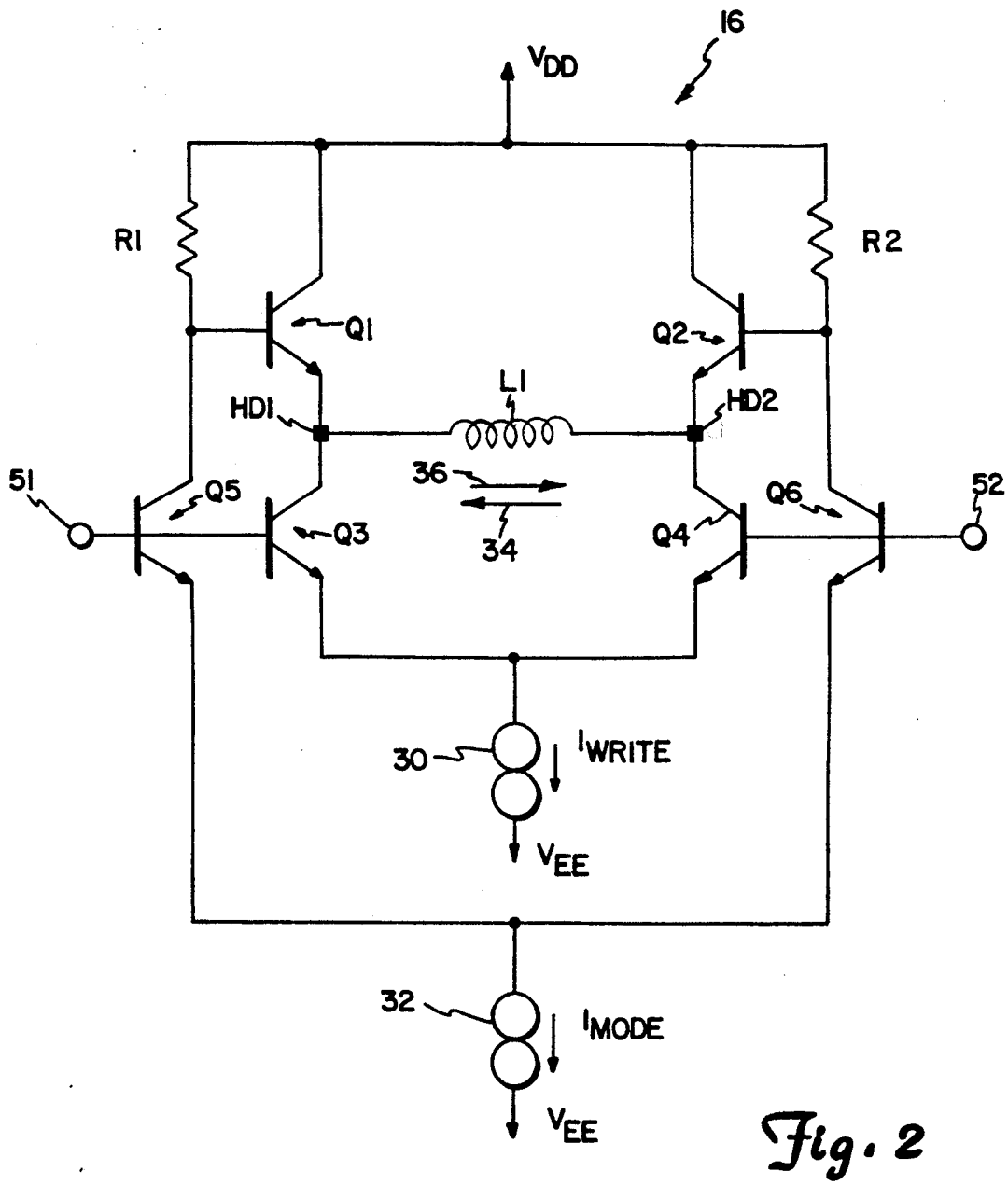
FIG. 2 is a detailed schematic diagram of known write data circuitry coupled to an inductive coil of a magnetic head.

FIG. 2 is detailed schematic diagram of a portion of write control circuitry 16 connected to inductive coil L1, as shown in FIG. 1. Write control circuitry 16 includes npn-type bias transistors Q5 and Q6, bias resistors R1 and R2, current sources 30 and 32, voltage rails $V_{dd}$ and $V_{ee}$, select terminals S1 and S2, and a typical H-switch formed by npn-type transistors Q1, Q2, Q3 and Q4.

Select terminal S1 is connected to the base terminals of transistors Q3 and Q5. Select terminal S2 is connected to the base terminals of transistors Q4 and Q6. Current source 32 is connected between voltage rail $V_{ee}$ and the emitter terminals of transistors Q5 and Q6. Current source 32 sources a current $I_{mode}$ for bias transistors Q5 and Q6 and bias resistors R1 and R2. The collector of transistor Q5 is connected to the base of transistor Q1 and to a first terminal of bias resistor R1. A second terminal of bias resistor R1 is connected to the collector of transistor Q1 and to voltage rail $V_{dd}$. Similarly, the collector of transistor Q6 is connected to the base of transistor Q2 and to a first terminal of bias resistor R2. A second terminal of bias resistor R2 is connected to the collector of transistor Q2 and to voltage rail $V_{dd}$.

Current source 30 is connected between voltage rail $V_{ee}$ and the H-switch at the emitters of transistors Q3 and Q4. Current source 30 sources a write current $I_{write}$ for the H-switch. The collector of transistor Q3 is connected to the emitter of transistor Q1 and to head contact HD1. Similarly, the collector of transistor Q4 is connected to the emitter of transistor Q2 and to head contact HD2. Voltage rail $V_{dd}$ is connected to the second terminals of bias resistors R1 and R2 and to the H-switch at the collectors of transistors Q1 and Q2.

During a write operation, the H-switch controls current direction through coil L1 (indicated by arrows 34 and 36) in response to the complementary write data control signals received at terminals S1 and S2. For example, when terminal S1 is HIGH, terminal S2 is LOW. Transistors Q3 and Q5 turn ON while transistor Q4 and Q6 turn OFF. Current $I_{mode}$ flows through transistor Q5 and pulls the base of transistor Q1 LOW toward voltage rail $V_{ee}$ to turn OFF transistor Q1. With transistor Q6 OFF, bias resistor R2 pulls the base of transistor Q2 HIGH toward voltage rail $V_{dd}$ and transistor Q2 turns ON. With transistors Q2 and Q3 ON and transistors Q1 and Q4 OFF, write current $I_{write}$ is directed from voltage rail $V_{dd}$ through transistor Q2, coil L1 and transistor Q3 in the direction indicated by arrow 34.

Alternatively, if select terminal S1 is LOW, terminal S2 will be HIGH. Transistors Q4 and Q6 turn ON while transistors Q3 and Q5 turn OFF. Current $I_{mode}$ flows through transistor Q6 and pulls the base of transistor Q2 LOW to turn transistor Q2 OFF. With transistor Q5 OFF, bias resistor R1 pulls the base of transistor Q1 HIGH to turn ON transistor Q1. Current $I_{write}$ will now flow in the opposite direction, indicated by arrow 36, from voltage rail $V_{dd}$ through transistor Q1, coil L1 and transistor Q4.

Because head current $I_{head}$ through coil L1 cannot change instantaneously from $-I_{write}$ to $+I_{write}$ when the complementary write data control signals toggle, the differential head voltage across head contacts HD1 and HD2 of coil L1 initially will be large until it stabilizes at the write current $I_{write}$, head resistance $R_{head}$ product ($I_{write} * R_{head}$).

Figure 3:
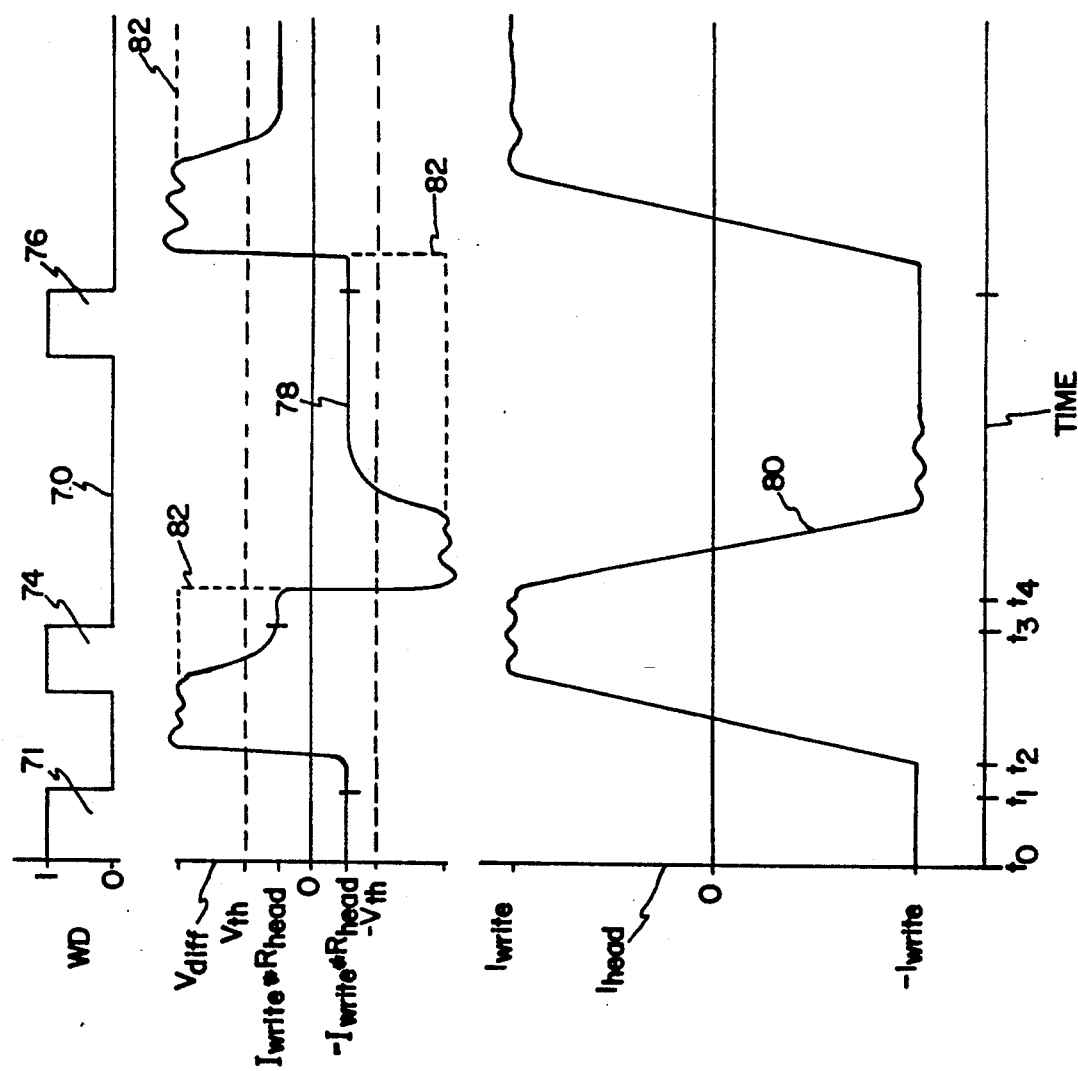
FIG. 3 is a timing diagram illustrating the operation of the detector circuitry shown in FIG. 1.

FIG. 3 is a timing diagram illustrating wave forms of the write data signals at terminal WD, differential head voltages $V_{diff}$ at head contacts HD1 and HD2 and head current $I_{head}$ through coil L1. Wave form 70 illustrates the write data signals applied to write data terminal WD and includes digital data pulses 72, 74 and 76. Wave form 78 illustrates differential head voltage signals $V_{diff}$ between head contacts HD1 and HD2. Wave form 80 illustrates magnetic head current $I_{head}$ through inductive coil L1. Wave forms 70, 78 and 80 are all illustrated as functions of time. Wave form 78 is representative of the differential head voltages of a connected, operative head. Wave form 82 (shown in broken lines) is representative of an open head. At time $t_0$, terminal WD is HIGH, terminal S1 is LOW, terminal S2 is HIGH, $V_{diff}$ is stable at $-(I_{write} * R_{head})$ and $I_{head}$ is equal to $-I_{write}$ (in the direction of arrow 34). Digital pulse 72 is indicative of a data transition in the write data signals at terminal WD.

Referring to FIGS. 1, 2 and 3, the falling edge of pulse 72 triggers toggle-type flip-flop 14 and causes the flip-flop to toggle the complementary write data control signals which are applied to select terminals S1 and S2. Terminal S1 switches to LOW and terminal S2 switches to HIGH. Differential head voltage $V_{diff}$ does not change until the effects of falling edge of pulse 72 propagate through flip-flop 14 and write data control circuitry 16. The propagation delay is approximately shown in FIG. 3 by time $t_2-t_1$.

Initially, when transistors Q1 and Q4 turn ON and transistors Q2 and Q3 turn OFF, coil L1 operates as an open-circuit. Differential head voltage $V_{diff}$ will be large and head current $I_{head}$ will begin to reverse from $-I_{write}$ to $+I_{write}$. Head contact HD1 will be at a voltage approximately equal to $V_{dd}$ minus the collector-to-emitter voltage drop of transistor Q1. Head contact HD2 will be at a voltage approximately equal to $V_{ee}$ plus the voltage drop across current source 30. In time, the differential head voltage $V_{diff}$ decreases and stabilizes at the $I_{write} * R_{head}$ product (at time $t_3$). Preferably, the differential head voltage $V_{diff}$ stabilizes before the next reversal in head current direction caused by data pulse 74 in the write data signals at terminal WD.

In a defective head, one which is either broken or not properly connected to head contacts HD1 of HD2, the differential head voltage $V_{diff}$ will not stabilize to the $I_{write} * R_{head}$ product before head current $I_{head}$ reverses at time $t_4$. Rather, the differential head voltage $V_{diff}$ remains near the difference between the rail voltages $V_{dd}$ and $V_{ee}$ (indicated by dashed wave form 82 in FIG. 3) because coil L1 remains an open-circuit.

Open Head Detector Circuit

Referring back to FIG. 1, open head detector circuit 10 monitors the differential head voltages $V_{diff}$ at head contacts HD1 and HD2 through differential input terminals 50 and 52 of differential amplifier 20. Differential amplifier 20 includes an output terminal 54 for producing amplified differential head voltage signals. Preferably, differential amplifier 20 has a gain of 1.

Comparator 22 includes differential input terminals 56 and 58 and output terminal 60. Differential input terminal 56 is connected to receive the amplified differential head voltage signals from output terminal 54. Differential input terminal 58 is connected to threshold source 28. Threshold source 28 supplies a threshold voltage $V_{th}$ that is between a differential head voltage of a stabilized, connected head and a differential head voltage of an open head. Comparator 22 compares the amplified differential head voltage signals to threshold voltage $V_{th}$ and generates digital comparator signals at output terminal 60 representative of the comparison. For example, comparator 22 generates a logic HIGH signal at output terminal 60 when the differential head voltage signals are greater than threshold voltage $V_{th}$. Comparator 22 supplies a logic LOW signal at output terminal 60 when the amplified differential head voltage signals are less than threshold voltage $V_{th}$.

D-type flip-flop 24 includes data input terminal D, clock input terminal CK and output data terminal Q. Input data terminal D is connected to output terminal 60 to receive the digital comparator signals. Clock input terminal CK is connected to write data terminal WD to receive the write data signals. The falling edges of the digital data pulses 72, 74 and 76 (shown in FIG. 3) trigger sampling of the digital comparator signals at data input terminal D. D-type flip-flop 24 produces an open head fault signal at output terminal Q representative of the sampled digital comparator signals. For example, the open head fault signal indicates a defective head when the fault signal is a logic HIGH, and indicates a functioning or connected head when the signal is a logic LOW.

OR-gate 26 includes input terminals 62 and 64 and output terminal 66. Input terminal 62 is connected to receive the open head fault signals from output terminal Q of flip-flop 24. Input terminal 64 is connected to terminal 68 for receiving other write fault signals generated by other write data circuitry (not shown). OR-gate 26 generates a HIGH write unsafe signal at output terminal 66 when either the open head fault signals or the other write fault signals are a logic HIGH.

A control portion of the magnetic storage system (not shown) monitors the write unsafe signals during write operations. When the write unsafe signals indicate that magnetic head 18 is defective, the magnetic storage system shuts down to prevent data loss caused by writing through a defective head.

In one alternative embodiment, head contacts HD1 and HD2 (shown in FIG. 1) are connected directly to comparator 22. Differential amplifier 20 is optional. Comparator 22 compares the voltage at each of the head contacts with threshold voltage $V_{th}$. If the voltage at either head contact HD1 or HD2 remains above threshold voltage $V_{th}$ at the time of sampling, the detector circuit produces an open head fault signal.

In another alternative embodiment, only one of the head contacts HD1 or HD2 are connected to comparator 22. Comparator 22 compares the voltage at the head contact with threshold voltage $V_{th}$. If the voltage at the head contact is greater than threshold voltage $V_{th}$ at the time of sampling, detector circuit 10 produces an open head fault signal. Because a particular head contact voltage is either relatively positive or relatively negative, depending upon current direction in magnetic head 18, detector circuit 10 will detect open head faults at every second reversal in head current direction.

Detection Operation

During the write operation, write data circuitry 12 receives digital pulse 72 at write data terminal WD. The falling edge of the pulse 72 at time $t_1$ triggers both toggle-type flip-flop 14 and D-type flip-flop 24. As discussed above, the pulse 72 initiates a reversal in current direction through coil L1. D-type flip-flop 24 samples the digital comparator signals at data input terminal D before the effects of pulse 72 propagate through toggle-type flip-flop 14, write control circuitry 16, differential amplifier 20 and comparator 22. D-type flip-flop 24 samples the digital comparator signals that indicate whether differential voltage signals $V_{diff}$ are less than threshold voltage $-V_{th}$. In this manner, open head detector circuit 10 determines whether differential head voltages $V_{diff}$ at head contacts HD1 and HD2 have stabilized to the $-(I_{write} * R_{head})$ product after the previous reversal in write current through magnetic head 18. If differential head voltages $V_{diff}$ remain greater (more negative) than threshold voltage $-V_{th}$, D-type flip-flop 24 generates an open head fault signal at output terminal Q.

After propagation delay $t_2-t_1$, $V_{diff}$ and $I_{head}$ change in response to digital data pulse 72. Current flow $I_{head}$ through magnetic head 18 reverses and stabilizes at $+I_{write}$ (indicated by arrow 36 in FIG. 2). Differential head voltage signals $V_{diff}$ initially swing greatly positive then stabilize at $I_{write} * R_{head}$, below threshold voltage $V_{th}$. Digital data pulse 74 initiates the next reversal in head current direction. At time $t_3$, the falling edge of pulse 74 causes D-type flip-flop 24 to sample the digital comparator signals. Because the differential voltages $V_{diff}$ have dropped below threshold voltage $V_{th}$ by time $t_3$, the open head fault signal produced at output terminal Q of flip-flop 24 is LOW to indicate an operative head.

If magnetic head 18 is disconnected or broken, the differential head voltages $V_{diff}$ do not stabilize toward $I_{write} * R_{head}$ but remain above threshold voltage $V_{th}$, as indicated by wave form B2 (shown in broken lines). In this situation, comparator 22 generates logic HIGH digital comparator signals that indicate the amplified differential head voltages are greater than threshold voltage $V_{th}$ at time $t_3$ when D-type flip-flop 24 samples the digital comparator signals. As a result, D-type flip-flop 24 generates a logic HIGH signal at output terminal Q to force a write unsafe condition at output terminal 66 of OR-gate 26. The write unsafe condition causes the magnetic storage system to shut down to prevent any loss of data through the defective head.

Conclusion

It is important to note that a subsequent write data pulse, which causes a future reversal in head current, triggers the open head detector circuit of the present invention to determine whether the head voltages have stabilized below the threshold voltage following a previous reversal in head current.

The open head detector circuit of the present invention is substantially insensitive to variances in parameters of write data circuitry that plagued detector circuits of the prior art. The open head detector circuit of the present invention is not dependant upon the length of time the differential head voltages take to stabilize at the head current, head resistance product. Data from the previous write data signal will not be written accurately unless the differential head voltages stabilize before the next, subsequent write data signal reverses the head current. Because sampling of the digital comparator signals is triggered by the subsequent write data signals, the open head detector circuit of the present invention may be used at any data rate.

The open head detector circuit of the present invention is also relatively insensitive to variable head loads (head inductance) and write currents which affect the magnitude of the differential head voltages. In a typical storage system, the differential voltage of an open head is quite large compared to the stabilized voltage of a connected head. For example, the differential voltage of an open head may be about 6.8 volts while the stabilized differential voltage of a connected head may be about 0.8 volts (with a write current of 40 milliamps and a head resistance of 20 ohms). Therefore, if the threshold voltage is selected between about 1 volt and 5 volts, a comparison between the threshold voltage and the stabilized voltage will be relatively insensitive to minor fluctuations or variances in differential head voltage.

The open head detector circuit of the present invention is "system insensitive". As a result, the open head detector circuit of the present invention improves reliability by reducing reports of false errors and non-reporting of actual errors. Because the present invention is insensitive to varying data rates and head loads, the present invention may be used practically in any magnetic storage system.

Although the present invention has been described with reference to preferred embodiments, workers skilled in the art will recognize that changes may be made in form and detail without departing from the spirit and scope of the invention.

What is claimed is:

1. An open head detector circuit for detecting an open-circuit condition in a magnetic head having head contacts electrically coupled to write data circuitry responsive to write data signals for controlling current flow through the magnetic head, the detector circuit comprising:
   a threshold source for generating a threshold voltage that is between a head contact voltage representative of a connected head and a head contact voltage representative of an open head;
   a comparator coupled to receive head voltage signals from the head contacts and coupled to the threshold source for comparing the head voltage signals to the threshold voltage and for generating comparator signals representative of the comparison; and
   sampling circuitry coupled to the comparator and configured for coupling to receive the write data signals for sampling the comparator signals in response to the write data signals and before the write data signals affect the comparator signals.

2. The open head detector circuit of claim 1 wherein the magnetic head includes first and second head contacts and wherein the open head detector circuit further comprises a differential amplifier connected between the first and second head contacts and the comparator, the differential amplifier having a first input terminal electrically connected to the first head contact, a second input terminal electrically connected to the second head contact and an output terminal connected to the comparator for producing amplified differential head voltage signals representative of differential voltages across the first and second head contacts.

3. The open head detector circuit of claim 2 wherein the differential amplifier has a gain of 1.

4. The open head detector circuit of claim 1 wherein the comparator comprises a first input terminal electrically connected to receive the head voltage signals, a second input terminal electrically connected to the threshold source, and an output terminal providing the comparator signals.

5. The open head detector circuit of claim 1 wherein the comparator signals are digital comparator signals.

6. The open head detector circuit of claim 5 wherein the sampling circuitry comprises a D-type flip-flop having a data input terminal electrically connected to receive the digital comparator signals from the comparator, a clock input terminal electrically connected to receive the write data signals, and an output terminal providing open head fault signals based upon the sampled digital comparator signals.

7. The open head detector circuit of claim 6 and further comprising an OR gate that is coupled to the output terminal of the D-type flip-flop and is coupled to receive other write fault signals for performing a logical OR function between the open head fault signals and the other write fault signals to generate write unsafe output signals.

8. A method of detecting an open head condition in a magnetic head comprising the steps of:
   sensing voltages at magnetic head contacts;
   comparing the voltages at the magnetic head contacts to a reference voltage that is between a head contact voltage representative of a connected head and a head contact voltage representative of an open head;

providing comparator signals representative of the comparison;

receiving a write data signal;

sampling the comparator signals upon detection of the write data signal, before the write data signal affects the comparator signals;

providing open head fault signals as a function of the sampled comparator signals; and reversing current direction in the magnetic head in response to the write data signal.

9. The method of claim 8 wherein the step of sensing voltages includes the steps of:

monitoring differential voltages across the magnetic head contacts with first and second input terminals of a differential amplifier; and producing amplified differential head voltage signals representative of the differential voltages.

10. The method of claim 9 wherein the step of comparing voltages at the magnetic head contacts to a reference voltage includes the step of comparing the amplified differential head voltage signals to the reference voltage.

11. The method of claim 8 wherein the step of providing comparator signals representative of the comparison includes the step of providing digital comparator signals representative of the comparison.

12. The method of claim 11 wherein the step of providing digital comparator signals includes the step of providing digital comparator signals indicative of whether the voltages at the head contacts are greater than the reference voltage.

13. The method of claim 11 wherein the step of sampling the comparator signals includes the step of sampling the digital comparator signals.

14. The method of claim 13 wherein the step of sampling the digital comparator signals includes the steps of:

applying the digital comparator signals to a data input terminal of a D-type flip-flop;

applying the write data signal to a clock input terminal of the D-type flip-flop; and latching the digital comparator signals upon detection of the write data signal.

15. The method of claim 14 wherein the step of latching the digital comparator signals includes the step of latching the digital comparator signals upon detection of an edge of a digital data pulse.

16. The method of claim 14 wherein the step of providing open head fault signals includes the step of providing open head fault signals representative of the latched digital comparator signals.

17. The method of claim 15 and further comprising the steps of:

Receiving other write fault signals from other write data circuitry; and performing a logical OR function on the open head fault signals with the other write data fault signals to produce write unsafe signals.

18. The method of claim 13 wherein the step of providing an open head fault signal includes the step of providing an open head fault signal when the sampled comparator signals indicate the voltages at the head contacts are greater than the reference voltage.

19. The method of claim 13 wherein the step of sensing voltages at magnetic head contacts includes the step of sensing differential voltages across the magnetic head contacts.

20. The method of claim 8 wherein the step of receiving a write data signal includes the step of receiving a digital pulse.

21. The method of claim 19 wherein the step of sampling the comparator signals includes the step of sampling the comparator signals before changes in the voltages at the magnetic head contacts, caused by the step of reversing current direction in the magnetic head, propagate to affect the comparator signals.

* * * * *